(12) United States Patent
Wu et al.

(10) Patent No.: US 12,149,198 B2
(45) Date of Patent: Nov. 19, 2024

(54) METHOD OF ADAPTIVELY CONTROLLING BRUSHLESS DC MOTOR

(71) Applicant: DELTA ELECTRONICS, INC., Taoyuan (TW)

(72) Inventors: Chia-Feng Wu, Taoyuan (TW); Chien-Sheng Lin, Taoyuan (TW); Jou-Sheng Wang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 204 days.

(21) Appl. No.: 17/893,778

(22) Filed: Aug. 23, 2022

(65) Prior Publication Data

US 2022/0416695 A1  Dec. 29, 2022

Related U.S. Application Data

(63) Continuation-in-part of application No. 17/159,103, filed on Jan. 26, 2021, now abandoned, which is a continuation-in-part of application No. 16/425,934, filed on May 29, 2019, now abandoned.

(30) Foreign Application Priority Data

Nov. 7, 2018  (CN) .......................... 201811318256.1

(51) Int. Cl.
*H02P 6/14* (2016.01)
*G01M 13/04* (2019.01)
*G08B 21/18* (2006.01)
*H02P 29/024* (2016.01)

(52) U.S. Cl.
CPC ............... *H02P 6/14* (2013.01); *G01M 13/04* (2013.01); *G08B 21/187* (2013.01); *H02P 29/024* (2013.01)

(58) Field of Classification Search
CPC ..... H02P 29/024; G05B 23/0264; G05B 1/01; G05B 9/00; G05B 7/00; G05B 19/048; H02H 1/0053; H02H 3/28; H02H 7/00; H02H 11/00
See application file for complete search history.

(56) References Cited

U.S. PATENT DOCUMENTS

2016/0132050 A1* 5/2016 Heller .................... H02P 29/60
702/34

* cited by examiner

*Primary Examiner* — Said Bouziane
(74) *Attorney, Agent, or Firm* — Chin-Ming Shih; HDLS IPR SERVICES

(57) ABSTRACT

A method of adaptively controlling a brushless DC motor includes steps of: controlling the brushless DC motor rotating at a first speed according to an operation curve, accumulating a running time of the brushless DC motor, estimating a remaining used time of a bearing of the brushless DC motor according to the accumulated running time, executing an alarm operation when the remaining used time is less than a predetermined time, and decreasing the speed of the brushless DC motor to run at a second speed to prolong the used time of the bearing.

19 Claims, 12 Drawing Sheets

| bit7 | bit6 | bit5 | bit4 | bit3 | bit2 | bit1 | bit0 |
|---|---|---|---|---|---|---|---|
| alarm indication | power failure abnormality | current limiting abnormality | motor phase sequence abnormality | overvoltage abnormality | overcurrent abnormality | operation abnormality | startup abnormality |

FIG.7

METHOD OF ADAPTIVELY CONTROLLING BRUSHLESS DC MOTOR

CROSS-REFERENCE TO RELATED APPLICATIONS

This application is a continuing-in part application of U.S. patent application Ser. No. 17/159,103 filed on Jan. 26, 2021, which is a continuing-in part application of U.S. patent application Ser. No. 16/425,934 filed on May 29, 2019, which claims priority to CN201811318256.1 filed Nov. 7, 2018. The entire disclosures of the above applications are all incorporated herein by reference.

BACKGROUND

Technical Field

The present disclosure relates to a brushless DC motor, and more particularly to a brushless DC motor with used time estimation and a method of estimating used time of a brushless DC motor.

Description of Related Art

The statements in this section merely provide background information related to the present disclosure and do not necessarily constitute prior art.

A brushless DC Motor (BLDC Motor) is a DC motor without electric brushes and commutators. Compared with the traditional brushed DC motor, the carbon brush of the traditional brushed DC motor would produce toner while the brushed DC motor operating for a long time. The accumulated toner may explode in the high temperature environment during operation of the brushed DC motor, it needs to be cleaned regularly and therefore resulted in the high maintenance cost. Therefore, the brushless DC motor is safer and more reliable than the brushed DC motor. It has the advantages of good stability, high efficiency, long working life, etc., and is widely used in different fields such as electrical appliances, automobiles, aerospace, consumer, medical, industrial automation equipment.

However, in the prior art brushless DC motor, when an abnormal condition occurs, the brushless DC motor enters a protection state, and waits for a period of time to restart the brushless DC motor. For developers (or operators, users, etc.), the developers can't get detailed information about the previous abnormal situation, so it is impossible to grasp the history of the abnormal operation of the brushless DC motor. In contrast, verification and analysis must be performed through multiple attempts (try and error) until the type of abnormal condition and the cause of occurring the abnormal condition are identified. To do this, it takes much labor and time, and it cannot improve production efficiency and improve product quality.

The brushless DC motor uses an electronic circuit to generate a rotating magnetic field to drive a rotatable magnet. Since the coil is fixed, a large current can flow, and there is no carbon brush structure, only the bearing of the brushless DC motor will be worn. Therefore, the brushless DC motor can generate a large amount of power and can also run at a high speed. Compared with the life span of a brushed DC motor that the key lies in the brush and commutator, while the life span of the brushless DC motor is mainly determined by the bearing. In other words, the working time limit of the brushless DC motor is mainly determined by the life span of the bearing.

Therefore, how to design a brushless DC motor with used time estimation and a method of estimating used time of a brushless DC motor to solve the above technical problems is an important subject studied by the inventors with the present disclosure.

SUMMARY

An object of the present disclosure is to provide a brushless DC motor with used time estimation to estimate a used time of a bearing of the brushless DC motor so as to ensure the operation quality of the brushless DC motor by monitoring/acquiring the life span of the bearing and providing the real-time alarm signal.

In order to achieve the foregoing objective, the brushless DC motor with used time estimation includes an integrated circuit chip. The integrated circuit chip is electrically connected to a drive circuit of the brushless DC motor. The integrated circuit chip includes a detection unit, a central processing unit, and a flash memory. The detection unit detects an operation state of the brushless DC motor. The central processing unit is connected to the detection unit, and receives the operation state. The flash memory is connected to the central processing unit. When the central processing unit determines that the brushless DC motor is in a normal operation state, the central processing unit calculates a running time. When the central processing unit determines that the brushless DC motor is in an abnormal operation state, the central processing unit records the running time and updates an accumulated running time. The central processing unit estimates a used time of a bearing of the brushless DC motor according to the accumulated running time, and determines a life span of the bearing according to the used time of the bearing.

Another object of the present disclosure is to provide a method of estimating used time of a brushless DC motor to estimate a used time of a bearing of the brushless DC motor so as to ensure the operation quality of the brushless DC motor by monitoring/acquiring the life span of the bearing and providing the real-time alarm signal.

In order to achieve the foregoing another objective, the method of estimating used time of the brushless DC motor includes steps of: calculating a running time of the brushless DC motor when the brushless DC motor is in a normal operation state, recording the running time when the brushless DC motor is in an abnormal operation state, updating an accumulated running time, estimating a used time of a bearing of the brushless DC motor according to the accumulated running time, and determining a life span of the bearing according to the used time of the bearing.

BRIEF DESCRIPTION OF DRAWINGS

FIG. 7 is a schematic diagram of an error code with 8 bits according to the present disclosure.

DETAILED DESCRIPTION

Figure 1:
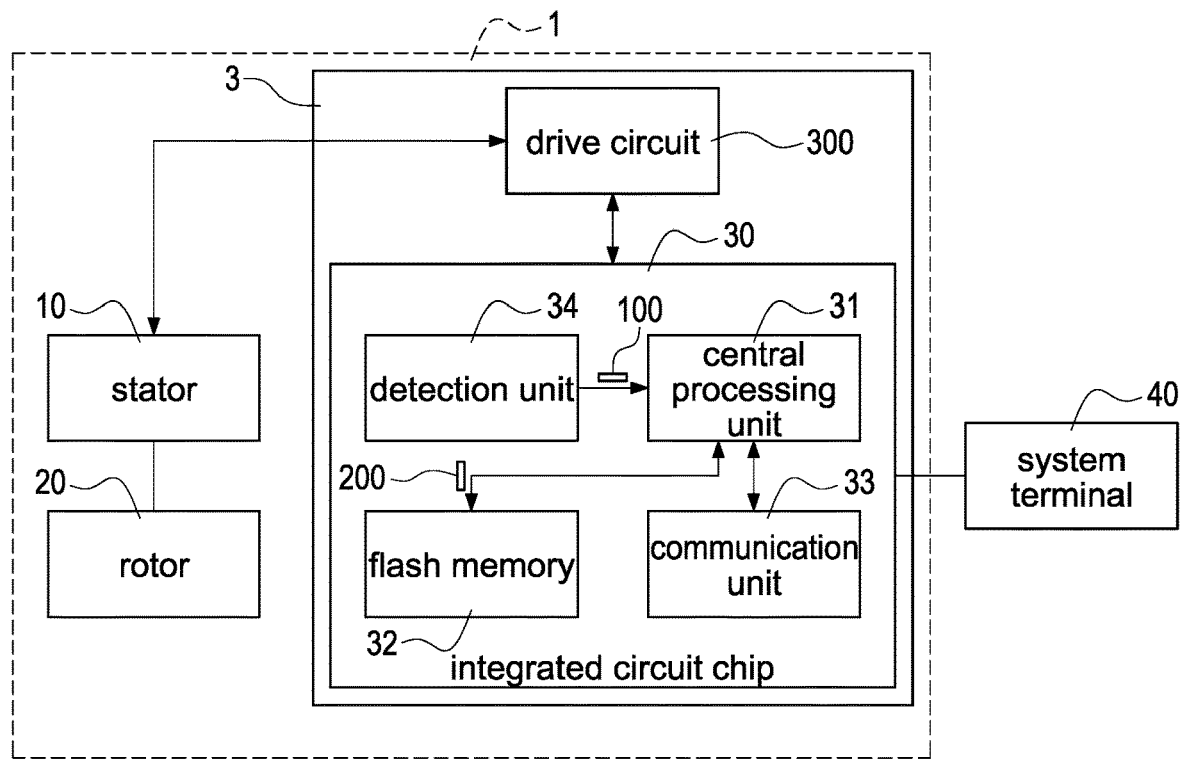
FIG. 1 is a schematic structural diagram of a first embodiment of a brushless DC motor with automatic record of abnormal operation according to the present disclosure.

The embodiments of the present disclosure are described by way of specific examples, and those skilled in the art can readily appreciate the other advantages and functions of the present disclosure. The present disclosure may be embodied or applied in various other specific embodiments, and various modifications and changes can be made without departing from the spirit and scope of the present disclosure.

It should be understood that the structures, the proportions, the sizes, the number of components, and the like in the drawings are only used to cope with the contents disclosed in the specification for understanding and reading by those skilled in the art, and it is not intended to limit the conditions that can be implemented in the present disclosure, and thus is not technically significant. Any modification of the structure, the change of the proportional relationship, or the adjustment of the size, should be within the scope of the technical contents disclosed by the present disclosure without affecting the effects and the achievable effects of the present disclosure.

Figure 2:
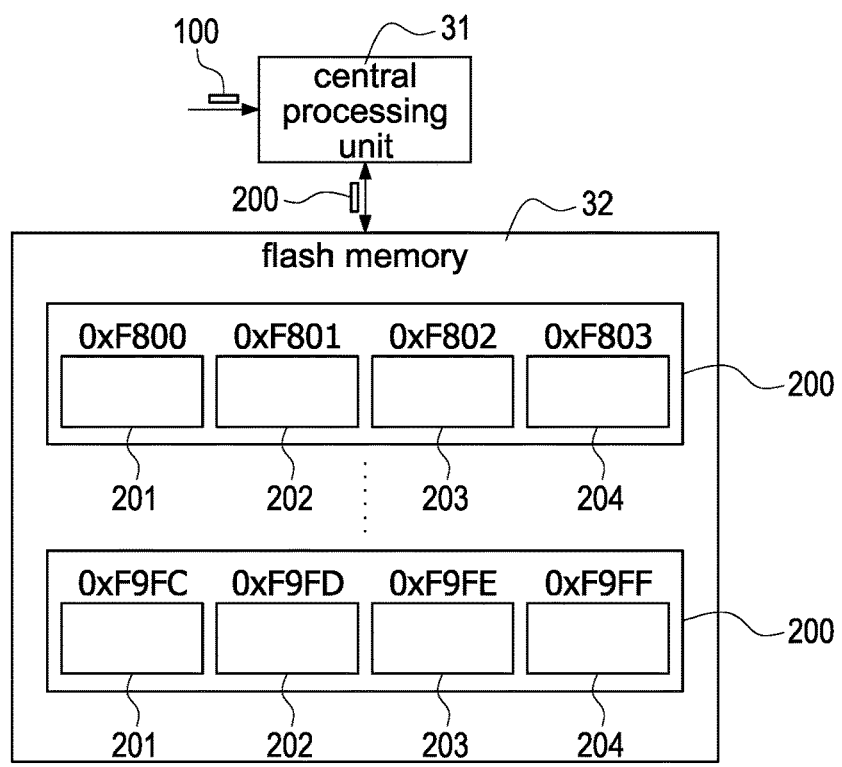
FIG. 2 is a schematic diagram of a flash memory of the first embodiment of the brushless DC motor with automatic record of abnormal operation according to the present disclosure.

The technical content and detailed description of the present disclosure will be described below in conjunction with the drawings. Referring to FIG. 1 and FIG. 2, FIG. 1 is a schematic structural diagram of a first embodiment of a brushless DC motor with automatic record of abnormal operation according to the present disclosure; FIG. 2 is a schematic diagram of a flash memory of the first embodiment of the brushless DC motor with automatic record of abnormal operation according to the present disclosure.

The first embodiment of the brushless DC motor 1 with automatic record of abnormal operation of the present disclosure includes a stator 10, a rotor 20 and a control circuit 3. The control circuit 3 includes an integrated circuit chip 30 and a drive circuit 300 (for example, it can be a bridge circuit) electrically connected to the integrated circuit chip 30. The brushless DC motor 1 with simple structure has a permanent magnet and two sets of (four) coils, and the two sets of coils alternately interact. The permanent magnet is disposed on the rotor 20, the coils are wound on the stator 10, and the drive circuit 300 is electrically connected to the coils of the stator 10 for driving the brushless DC motor 1, but the present disclosure is not limited thereto.

Further, the integrated circuit chip 30 is electrically connected to the stator 10 via the drive circuit 300. In the first embodiment of the present disclosure, the integrated circuit chip 30 may be one of a micro control unit (MCU), a microprocessor unit (MPU), an application-specific integrated circuit (ASIC), and a system on a chip (SoC). The integrated circuit chip 30 includes a central processing unit 31, a flash memory 32, a communication unit 33, and a detection unit 34. The central processing unit 31 is electrically connected to the flash memory 32, the communication unit 33, and the detection unit 34, respectively. The detection unit 34 may be a phase sequence abnormality detection unit, a rotation speed detection unit, a current detection unit or a voltage detection unit. The detection unit 34 is configured to detect a driving abnormality, a rotation speed, a current or a voltage of the brushless DC motor 1 to generate a detection signal 100 corresponding to the driving abnormality, the rotation speed, the current or the voltage.

Further, the central processing unit 31 may be a programmable integrated circuit. When the central processing unit 31 receives the detection signal 100 such as driving abnormality, rotation speed, current or voltage from the detection unit 34, and further determines whether the brushless DC motor 1 is in an abnormal operation state, that is to determine whether the brushless DC motor 1 is abnormally operated. For example, the abnormal operation state may be one of motor phase sequence abnormality, overvoltage abnormality, overcurrent abnormality, startup state abnormality, in-operation state abnormality, current limit abnormality, and power failure abnormality, as shown in FIG. 2. When the central processing unit 31 determines that the brushless DC motor 1 is in one or more than one of the abnormal operation states, the central processing unit 31 generates abnormal operation data 200 including an error code 202 so that the flash memory 32 automatically stores the abnormal operation data 200. Further, the error code 202 differs depending on the type of abnormal operation data 200. The abnormal operation data 200 includes one of a startup abnormality message, an operation abnormality message, an overcurrent abnormality message, an overvoltage abnormality message, a motor phase sequence abnormality message, a current limiting abnormality message, and a power failure abnormality message. See Table 1 below for details.

TABLE 1

Relationship between abnormal operation data and error code

| abnormal operation data | error code | UART' I²C' SPI | PWM Duty | PWM Frequency | I/O |
|---|---|---|---|---|---|
| startup abnormality | 00000001 | 0x01 | 10% | 100 Hz | HIGH |
| operation abnormality | 00000010 | 0x02 | 20% | 200 Hz | HIGH |
| overcurrent abnormality | 00000100 | 0x04 | 30% | 300 Hz | HIGH |
| overvoltage abnormality | 00001000 | 0x08 | 40% | 400 Hz | HIGH |
| motor phase sequence abnormality | 00010000 | 0x10 | 50% | 500 Hz | HIGH |
| current limiting abnormality | 00100000 | 0x20 | 60% | 600 Hz | HIGH |
| power failure | 01000000 | 0x40 | 70% | 700 Hz | HIGH |

TABLE 1-continued

Relationship between abnormal operation data and error code

| abnormal operation data | error code | UART I²C SPI | PWM Duty | PWM Frequency | I/O |
|---|---|---|---|---|---|
| abnormality alarm indication | 10000000 | 0x80 | 80% | 800 Hz | HIGH |

Corresponding to FIG. 7, which shows a schematic diagram of an error code with 8 bits according to the present disclosure. The bit 0 stores the message/information of the startup abnormality, the bit 1 stores the message of the operation abnormality, the bit 2 stores the message of the overcurrent abnormality, the bit 3 stores the message of the overvoltage abnormality, the bit 4 stores the message of the motor phase sequence abnormality, the bit 5 stores the message of the current limiting abnormality, the bit 6 stores the message of the power failure abnormality, and the bit 7 stores the message of the alarm indication (the detailed description will be made below).

As described above, when the abnormal operation data 200 is the startup abnormality message, the error code 202 corresponding to the abnormal operation data 200 is 00000001, and analog or digital data corresponding to different abnormal operation states may be transmitted through UART, I²C, SPI, pulse-width modulation (PWM) or I/O port to an external system terminal 40, which will be described in detail later. For example, as shown in Table 1, when the error code 202 corresponding to the abnormal operation data 200 is 00000001, the data of "0x01", "PWM Duty=10%", "PWM Frequency=100 Hz" or "HIGH level of a specific I/O pin" can be transmitted through UART, I²C, SPI to the system terminal 40. Therefore, the developer can know that the brushless DC motor 1 is under the "startup abnormality" from the data displayed by the system terminal 40. For another example, when the error code 202 corresponding to the abnormal operation data 200 is 00000100, the data of "0x04", "PWM Duty=30%", "PWM Frequency=300 Hz" or "HIGH level of a specific I/O pin" can be transmitted through UART, I²C, SPI to the system terminal 40. Therefore, the developer can know that the brushless DC motor 1 is under the "overcurrent abnormality" from the data displayed by the system terminal 40. The above exemplified numerical values are for convenience and clarity of illustration and are not intended to limit the present disclosure.

Further, when the central processing unit 31 receives the detection signal 100 such as driving abnormality, rotation speed, current or voltage from the detection unit 34, and further confirms that the brushless DC motor 1 is in an abnormal operation state, the central processing unit 31 restarts the brushless DC motor 1 after a protection time has elapsed.

The flash memory 32 is electrically connected to the central processing unit 31 for receiving instructions outputted by the central processing unit 31. The Flash memory 32 is a non-volatile and electronically erasable, programmable ROM (PROM). It is allowed to be erased or written multiple times during operation, mainly for general data storage, and for exchanging transmission data between computers and other digital products. Although flash memory is technically similar to EEPROM, but the erase cycle of old type EEPROM is quite slow, in contrast to flash memory, flash memory has an advantage of significant speed when writing large amounts of data in larger erase sectors.

In the first embodiment of the present disclosure, the flash memory 32 may be one of a NOR Flash, a NAND Flash, a 3D NAND Flash, a Single-Level Cell (SLC), a Multi-Level Cell (MLC), a Triple-Level Cell (TLC) or a Quad-Level Cell (QLC). As shown in FIG. 2, in the first embodiment of the present disclosure, the abnormal operation data 200 stored in the flash memory 32 may include a rotation speed value 201, an error code 202, and a pulse width modulation command input value 203 (PWM IN) and a reserved value 204 (the written data are not defined). The written addresses of the first abnormal operation data 200 are 0xF800, 0xF801, 0xF802, 0xF803, and the written addresses of the last abnormal operation data 200 are 0xF9FC, 0xF9FD, 0xF9FE, 0xF9FF. In addition, in other embodiments of the present disclosure, the pulse width modulation command input value 203 may also be replaced by at least one of a voltage value (not shown) and a current value (not shown).

When the flash memory 32 has insufficient storage space during storage of the abnormal operation data 200, the central processing unit 31 causes the flash memory 32 to clear the storage space within the flash memory 32, and then causes the flash memory 32 to store the abnormal operation data 200. The "clearing storage space" is to partially delete or completely delete the abnormal operation data 200 stored in the flash memory 32. In the first embodiment of the present disclosure, the "clearing storage space" is completely deleted the abnormal operation data 200 stored in the flash memory 32.

As shown in FIG. 1, the communication unit 33 is electrically connected to the central processing unit 31, and the central processing unit 31 transmits part or all of the abnormal operation data 200 stored in the flash memory 32 to the system terminal 40 through the communication unit 33. The communication unit 33 may be a UART, an I²C, an SPI, a pulse width modulation (PWM) or an I/O port for transmitting the abnormal operation data 200. In the first embodiment of the present disclosure, the error code 202 of the abnormal operation data 200 be transmitted through UART, I²C, SPI, pulse-width modulation (PWM) or I/O port according to an analog or digital data corresponding to different abnormal operation states to the external system terminal 40. As shown in Table 1 above, and the pulse width modulation (PWM) also includes PWM Duty and PWM Frequency.

Figure 3:
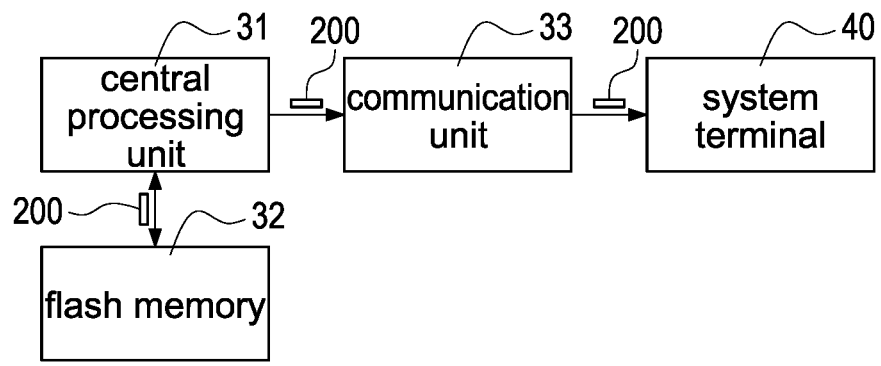
FIG. 3 is a schematic diagram of the first embodiment operating in an active mode of the brushless DC motor with automatic record of abnormal operation according to the present disclosure.
Figure 4:
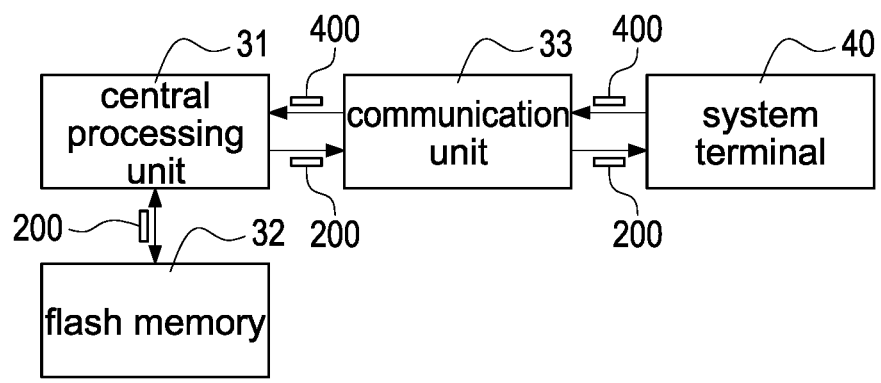
FIG. 4 is a schematic diagram of the first embodiment operating in a passive mode of the brushless DC motor with automatic record of abnormal operation according to the present disclosure.

Refer to FIG. 3 and FIG. 4, which are schematic diagrams of the first embodiment respectively operating in an active mode and in a passive mode of the brushless DC motor with automatic record of abnormal operation according to the present disclosure. The active mode means that the central processing unit 31 actively transmits the abnormal operation data 200 to the system terminal 40 through the communication unit 33. The passive mode means that the central processing unit 31 receives a transmission request sent from the system terminal 40, and then passively transmits the abnormal operation data 200 to the system terminal 40 through the communication unit 33. The detail operations are described as follows.

As shown in FIG. 3, in the active mode, when the central processing unit 31 determines that the brushless DC motor 1 is in an abnormal operation state according to the detection signal 100, the central processing unit 31 generates abnormal operation data 200 including an error code 202, and the flash memory 32 is automatically stored in the abnormal operation data 200. Meanwhile, the central processing unit 31 automatically extracts part or all of the abnormal operation data 200 stored in the flash memory 32, and then transmits part or all of the abnormal operation data 200 to the system terminal 40 through the communication unit 33.

As shown in FIG. 4, in the passive mode, when the central processing unit 31 detects that the system terminal 40 sends a request command 400 through the communication unit 33, the central processing unit 31 extracts part or all of the abnormal operation data 200 stored in the flash memory 32 according to the request command 400, and then transmits part or all of the abnormal operation data 200 to the system terminal 40 through the communication unit 33. In the embodiment of the present disclosure, the system terminal 40 may be one of a cloud server, a database, a workstation, a notebook computer, and a portable smart device.

Figure 5:
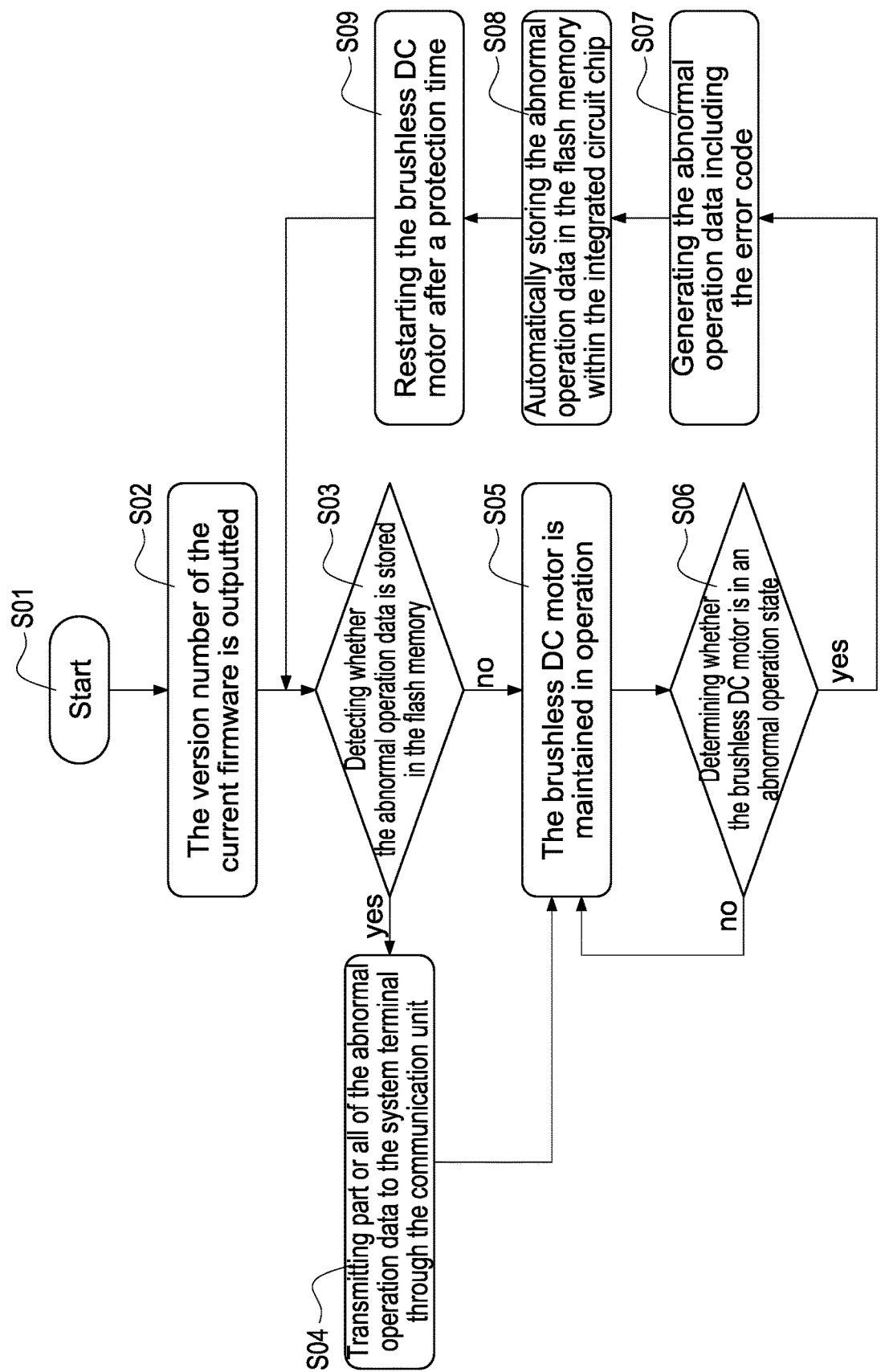
FIG. 5 is a flowchart showing an embodiment of a method of automatically recording abnormality for the brushless DC motor according to the present disclosure.
Figure 6:
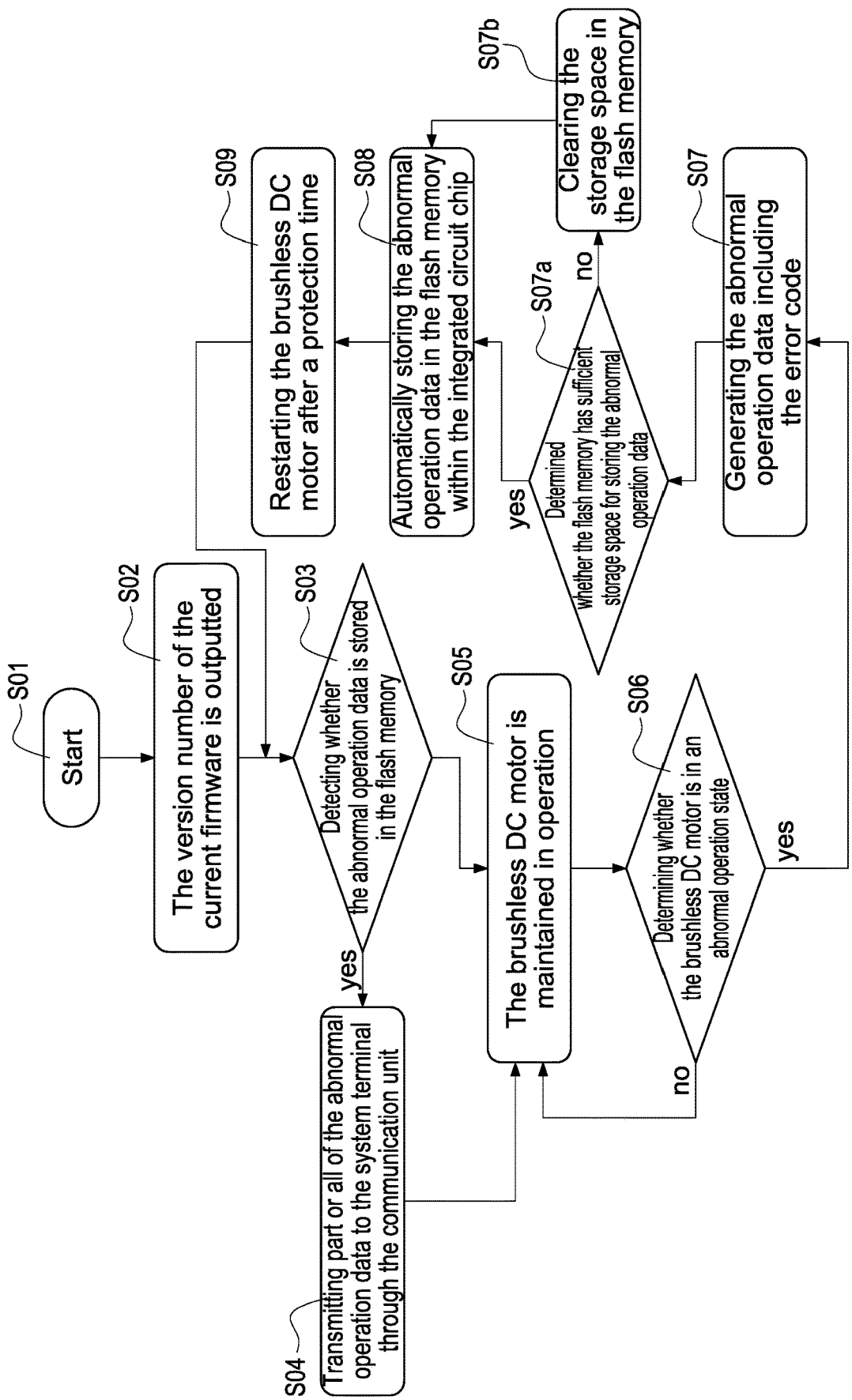
FIG. 6 is a flowchart showing another embodiment of the method of automatically recording abnormality for the brushless DC motor according to the present disclosure.

Please refer to FIG. 5 and FIG. 6. FIG. 5 is a flowchart showing an embodiment of a method for recording abnormality automatically with the brushless DC motor to the present disclosure, and the method is applied to the brushless DC motor 1 in operation. After the start (step S01), the version number of the current firmware is outputted (step S02) for confirmation by the user or developer. Afterward, the central processing unit 31 starts detecting whether the abnormal operation data 200 is stored in the flash memory 32 (step S03). If the central processing unit 31 detects that the abnormal operation data 200 is stored in the flash memory 32, the central processing unit 31 transmits part or all of the abnormal operation data 200 to the system terminal 40 through the communication unit 33 (step S04).

Afterward, the brushless DC motor 1 is maintained in operation (step S05), and the central processing unit 31 determines whether the brushless DC motor 1 is in an abnormal operation state (step S06). If the central processing unit 31 determines that the brushless DC motor 1 is in the abnormal operation state according to the detection result of the detection unit 34, the central processing unit 31 of the integrated circuit chip 30 correspondingly generates the abnormal operation data 200 including the error code 202 (step S07), and the abnormal operation data 200 are automatically stored in the flash memory 32 within the integrated circuit chip 30 (step S08). The active mode means that the central processing unit 31 actively transmits the abnormal operation data 200 to the system terminal 40 through the communication unit 33. The passive mode means that the central processing unit 31 receives a transmission request sent from the system terminal 40, and then passively transmits the abnormal operation data 200 to the system terminal 40 through the communication unit 33. In step S06, when the brushless DC motor 1 is determined not in an abnormal operation state, that is, the brushless DC motor 1 is in a normal operation, and the brushless DC motor 1 is continuously operated. Finally, after the flash memory 32 stores the abnormal operation data 200, the central processing unit 31 restarts the brushless DC motor 1 after a protection time (step S09), and then returns to step S03 to continuously perform detection and control.

Referring to FIG. 6, which is a flowchart showing another embodiment of the method for recording abnormality automatically with the brushless DC motor to the present disclosure. It is substantially the same as the foregoing embodiment, and is applied to the brushless DC motor 1 in operation, but one more step is added after the step S07. Before the flash memory 32 stores the abnormal operation data 200, it is determined whether the flash memory 32 has sufficient storage space for storing the abnormal operation data 200 (step S07a). If the storage space of the flash memory 32 is insufficient, the central processing unit 31 causes the flash memory 32 to clear the storage space in the flash memory (step S07b). Afterward, the flash memory 32 is caused to store the abnormal operation data 200 into the flash memory 32 within the integrated circuit chip 30 (step S08). The "clearing storage space" is to partially delete (for example, delete from the oldest part of the data) or delete all of the abnormal operation data 200 stored in the flash memory 32.

At this time, the developer can quickly obtain the detailed information of the previous abnormal condition about the brushless DC motor 1 by reading the abnormal operation data 200 stored in the flash memory 32, and no need to performed through multiple attempts for verification and analysis, saving labor costs and time costs, thereby increasing production efficiency and improving product quality.

Figure 8:
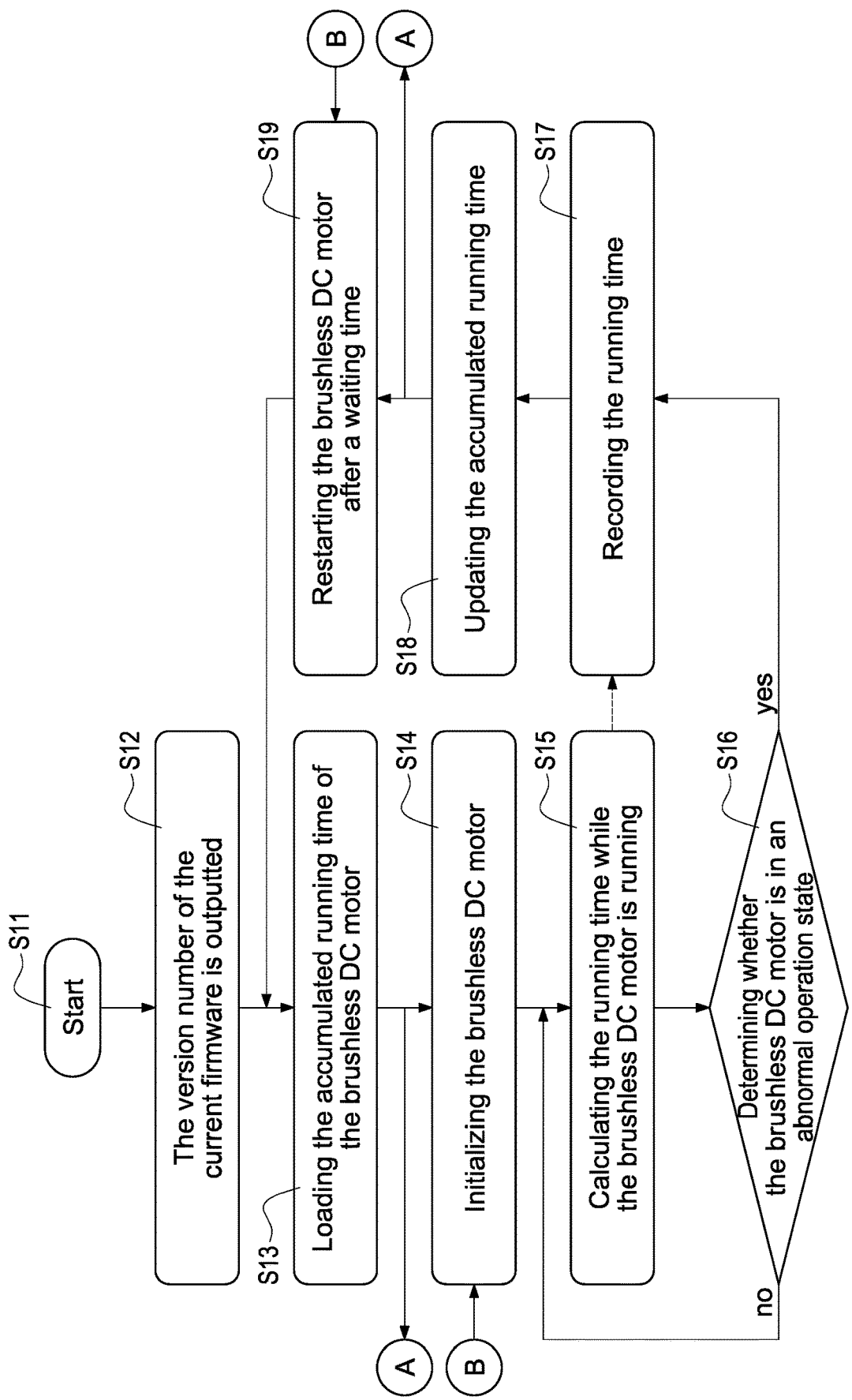
FIG. 8 is a flowchart of a method of estimating used time of the brushless DC motor according to the present disclosure.
Figure 9:
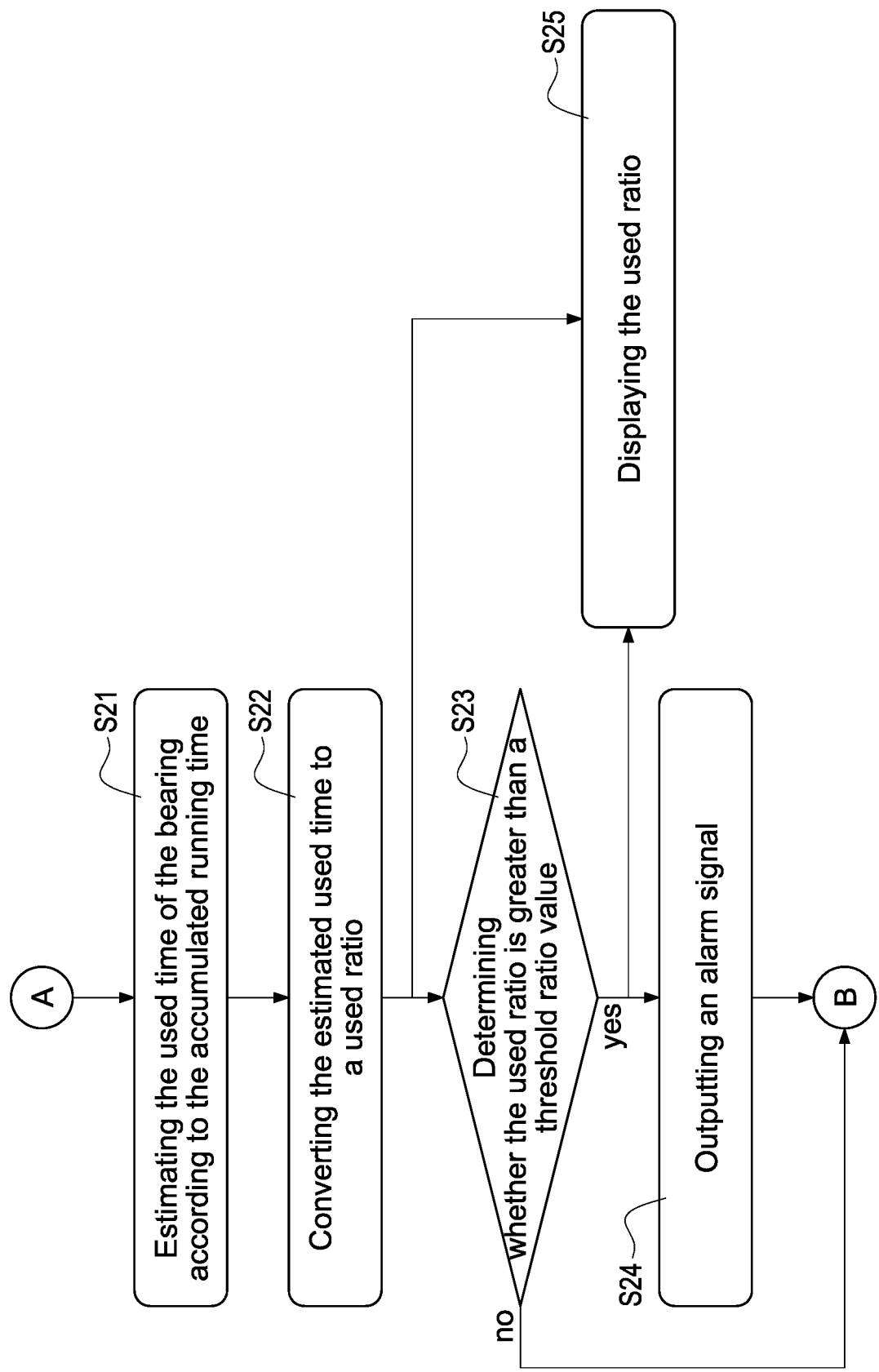
FIG. 9 is a flowchart continued from FIG. 8.

Please refer to FIG. 8 and FIG. 9, which show a flowchart of a method of estimating used time of a brushless DC motor according to the present disclosure. After the start (step S11), the version number of the current firmware is outputted (step S12) for confirmation by the user or developer. Afterward, the central processing unit 31 loads an accumulated running time of the brushless DC motor 1 (step S13). In particular, the accumulated running time means that the total accumulated running time of the brushless DC motor 1 from before to now. Also, the accumulated running time may be, for example but not limited to, stored in the flash memory 32 or other storage components/devices. Afterward, the brushless DC motor 1 is initialized (step S14) before the brushless DC motor 1 starts to run/rotate.

After the brushless DC motor 1 is completely initialized and the brushless DC motor 1 stats to normally run (i.e., the brushless DC motor 1 is in a normal operation state), the central processing unit 31 calculates a running time while the brushless DC motor 1 is normally running (step S15). Afterward, the central processing unit 31 determines whether the brushless DC motor 1 is in an abnormal operation state (step S16). In particular, the abnormal operation state includes a startup abnormality, an operation abnormality, an overcurrent abnormality, an overvoltage abnormality, a motor phase sequence abnormality, a current limiting abnormality, or a power failure abnormality. However, the present disclosure is not limited by the above-mentioned abnormality.

When the brushless DC motor 1 is still in the normal operation state, the running time of the brushless DC motor 1 is continuously calculated, i.e., the step S15 is repeatedly performed. If the brushless DC motor 1 occurs abnormality, i.e., the determination result of the step S16 is "YES", the central processing unit 31 records the running time of the brushless DC motor 1 (step S17). For example, it is assumed that a power failure abnormality occurs, and before this abnormality occurs, the brushless DC motor 1 have continuously run for 6 hours. Therefore, the 6-hour running time is recorded. Afterward, the central processing unit 31 updates the accumulated running time (step S18). In particular, the central processing unit 31 adds the recorded running time to the previous accumulated running time to update the accumulated running time. For example, it is assumed that the previous accumulated running time is 2400 hours, and therefore the accumulated running time updated by the central processing unit 31 is 2406 hours.

Afterward, after a waiting time, such as for example but not limited to 10 seconds, the brushless DC motor 1 is restarted (step S19). After the brushless DC motor 1 is restarted, the central processing unit 31 reloads the updated accumulated running time of the brushless DC motor 1, i.e., the step S13 is performed again. Accordingly, the accumulated running time of the brushless DC motor 1 can be continuously updated once the brushless DC motor 1 occurs abnormality.

In other embodiments, the timing of recording the running time does not have to be limited after the abnormality occurs. That is, even when the brushless DC motor 1 does not occurs abnormality, i.e., is in the normal operation state, the calculated running time in step (S15) can be recorded by the central processing unit 31. As shown in FIG. 8, a dotted line between the step S15 and step S17 may represent this operation. Specifically, the central processing unit 31 may record the calculated running time at regular intervals, such as every 2 hours. Afterward, the central processing unit 31 updates the accumulated running time (step S18). Accordingly, the accumulated running time of the brushless DC motor 1 can be monitored/acquired in real time.

Moreover, after the step S13 or after the step S18, an estimation procedure of a used time of a bearing of the brushless DC motor 1 can be performed. Take "after the step S13" as an example, as shown in FIG. 9, after the accumulated running time of the brushless DC motor 1 is loaded in step S13, the central processing unit 31 estimates the used time of the bearing according to the accumulated running time of the brushless DC motor 1 (step S21). For example, it is assumed that the accumulated running time is 2480 hours, and therefore the central processing unit 31 estimates that the used time of the bearing is 2480 hours. It is assumed that a preferred total used time is 8000 hours. Therefore, the central processing unit 31 can determine a life span of the bearing according to the used time of the bearing. Moreover, according to the used time of the bearing, the central processing unit 31 can perform a reminder or an alarm notification for users or operators. For example, it is assumed that a threshold time value is set to 6400 hours. When the central processing unit 31 determines that the used time of the bearing is greater than the threshold time value (i.e., 6400 hours), the central processing unit 31 generates/outputs an alarm signal or a reminder signal to notify the users or operators. Correspondingly, when the used time of the bearing is greater than the threshold time value, the bit 7 of the error code may be "1" so as to represent that the alarm indication is performed.

In another embodiment, the central processing unit 31 converts the estimated used time to a used ratio (step S22). According to the preferred total used time (i.e., 8000 hours) of the bearing, the central processing unit 31 converts the estimated used time (i.e., 2480 hours) to the used ratio which is equal to 31% (i.e., 2480/8000*100%). Similarly, if the estimated used time is 4000 hours, the used ratio is equal to 50%. Afterward, the central processing unit 31 determines whether the used ratio is greater than a threshold ratio value (step S23). In one embodiment, the threshold ratio value may be 80% (corresponding to the above-mentioned threshold time value (6400 hours)). Therefore, when the central processing unit 31 determines that the used ratio is greater than the threshold ratio value (i.e., 80%), the central processing unit 31 generates/outputs an alarm signal or a reminder signal to notify the users or operators (step S24). In particular, the alarm signal is provided to activate an alarm mechanism by a sound manner, a light manner, a text manner, or so on. On the contrary, if the used ratio is not greater than the threshold ratio value, the brushless DC motor 1 is initialized (step S14) and then the brushless DC motor 1 starts to run/rotate (step S15).

In one embodiment, the used time (or the used ratio) or the life span of the bearing may be displayed (step S25). Specifically, the central processing unit 31 may output the used time (or the used ratio) after the step S22 or after the step S23 to a display unit to display the used time (or the used ratio) or the life span. For example, the display unit may show/display the used time, such as 2480 hours or the used ratio, such as 31% to realize the users or operators.

Similarly, the above steps (step S21 to step S25) may be performed after the step S17, and the detail description is omitted here for conciseness.

Accordingly, the brushless DC motor with used time estimation and the method of estimating used time of the brushless DC motor are provided to estimate a used time of a bearing of the brushless DC motor so as to ensure the operation quality of the brushless DC motor by monitoring/acquiring the life span of the bearing and providing the real-time alarm signal.

Figure 10:
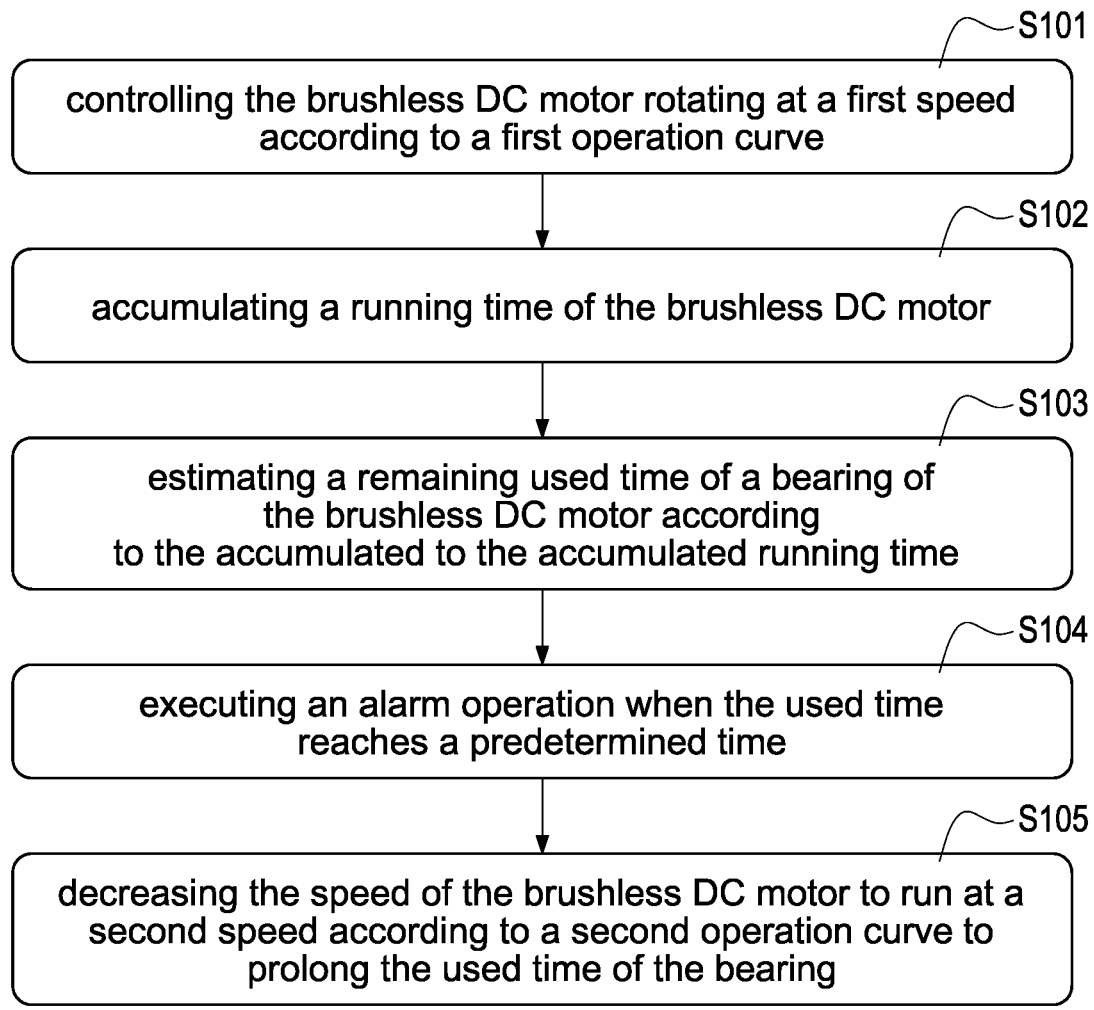
FIG. 10 is a flowchart of a method of adaptively controlling a brushless DC motor according to a first embodiment of the present disclosure.
Figure 13A:
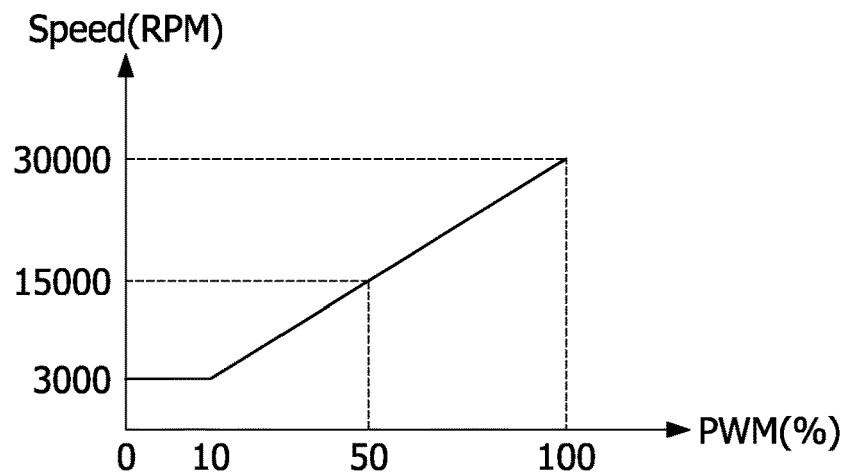
FIG. 13A to FIG. 13C are different operation curves of the brushless DC motor under different bearing life stage according to the present disclosure.
Figure 13B:
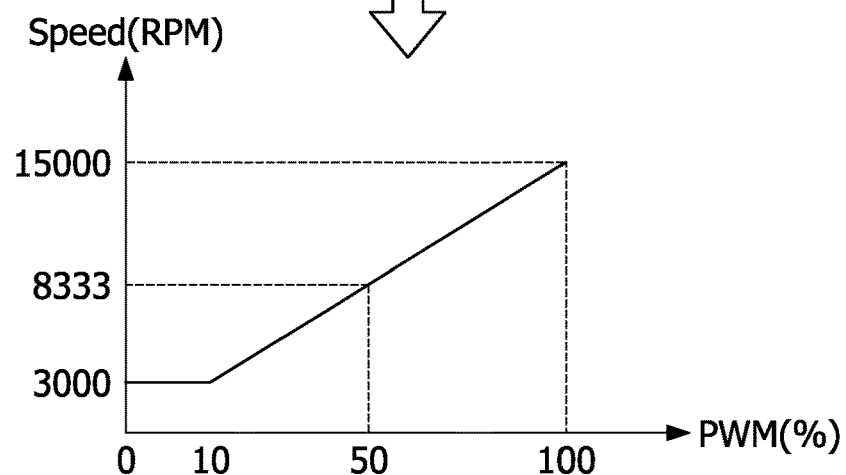
Figure 13C:
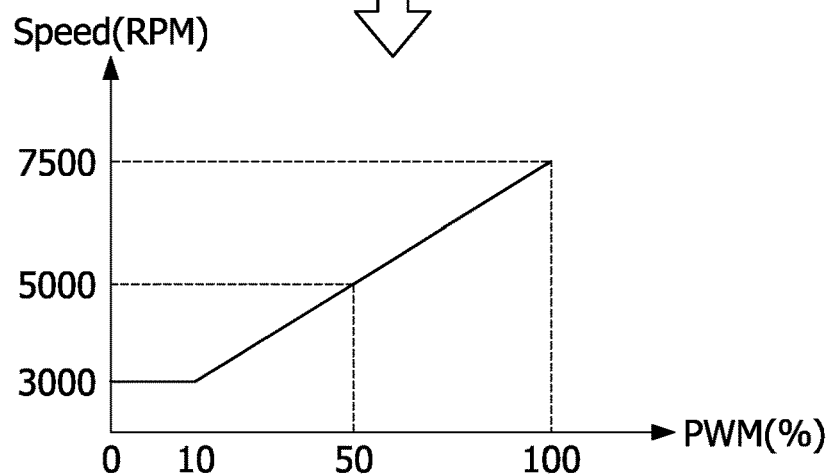

Please refer to FIG. 10, which shows a flowchart of a method of adaptively controlling a brushless DC motor according to a first embodiment of the present disclosure. The method includes the following steps of: controlling the brushless DC motor rotating at a first speed according to a first operation curve (S101). Please refer to FIG. 13A to FIG. 13C, which show different operation curves of the brushless DC motor under different bearing life stage according to the present disclosure. As shown in FIG. 13A, for example, in normal operation, the brushless DC motor rotates at 3000 rpm when a duty cycle of the PWM signal is 10%, and the brushless DC motor rotates at 15000 rpm when the duty cycle of the PWM signal is 50%, and the brushless DC motor rotates at 30000 rpm when the duty cycle of the PWM signal is 100%. Similarly, the relationships between the (rotation) speed of the brushless DC motor and the duty cycle of the PWM signal are shown in FIG. 13B and FIG. 13C, and the detail description is omitted here for conciseness.

Afterward, accumulating a running time of the brushless DC motor (S102). As mentioned above, the accumulated running time means that the total accumulated running time of the brushless DC motor 1 from before to now. Also, the accumulated running time may be, for example but not limited to, stored in the flash memory 32 or other storage components/devices. Moreover, as shown in FIG. 8, in step (S17), the running time of the brushless DC motor is recorded by the central processing unit 31, and in step (S18), the accumulated running time is updated. Also, the detailed description of recording, accumulating, and/or updating the running time of the brushless DC motor may refer to the above-mentioned description.

Afterward, estimating a remaining used time of a bearing of the brushless DC motor according to the accumulated running time (S103). In particular, the remaining used time can be displayed. Theoretically, the life of the bear (bear life) is related to a rotation speed (n) of the brushless DC motor, a basic rated dynamic loading (C), and an equivalent dynamic bearing load (P). Therefore, the basic rated life ($L_{10h}$) of the bearing may be expressed as follows.

$$L_{10h} = \left(\frac{10^6}{60n}\right)\left(\frac{C}{P}\right)^3$$

In which, C is 22500N, P is 476.6N, and when the brushless DC motor rotates at 30000 rpm, the bearing life (i.e., the useable time is 58453 hours, that is, $$L_{10h} = \left(\frac{10^6}{60*30000}\right)\left(\frac{22500}{476.6}\right)^3 = 58453$$

Figure 12:
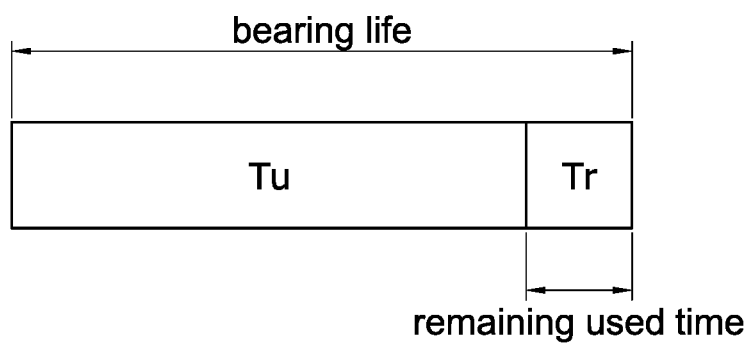
FIG. 12 is a schematic view of used time and remaining used time of a bearing of the brushless DC motor according to the present disclosure.

Therefore, in the step (S103), the remaining used time Tr of the bearing is equal to the bearing life (i.e., the usable time) minus the used time Tu (i.e., the accumulated running time), as shown in FIG. 12. For example, when the brushless DC motor rotates under the operation curve shown in FIG. 13A, the bearing life is 58453 (also refer to FIG. 14, the top part shows the approximately total 58000-hour bearing life of the bearing). Therefore, when the accumulated used time of the bearing is 8000 hours, the remaining used time Tr is approximately 50000 hours. Similarly, when the accumulated used time of the bearing is 18000 hours, the remaining used time Tr is approximately 40000 hours, and so on.

Figure 14:
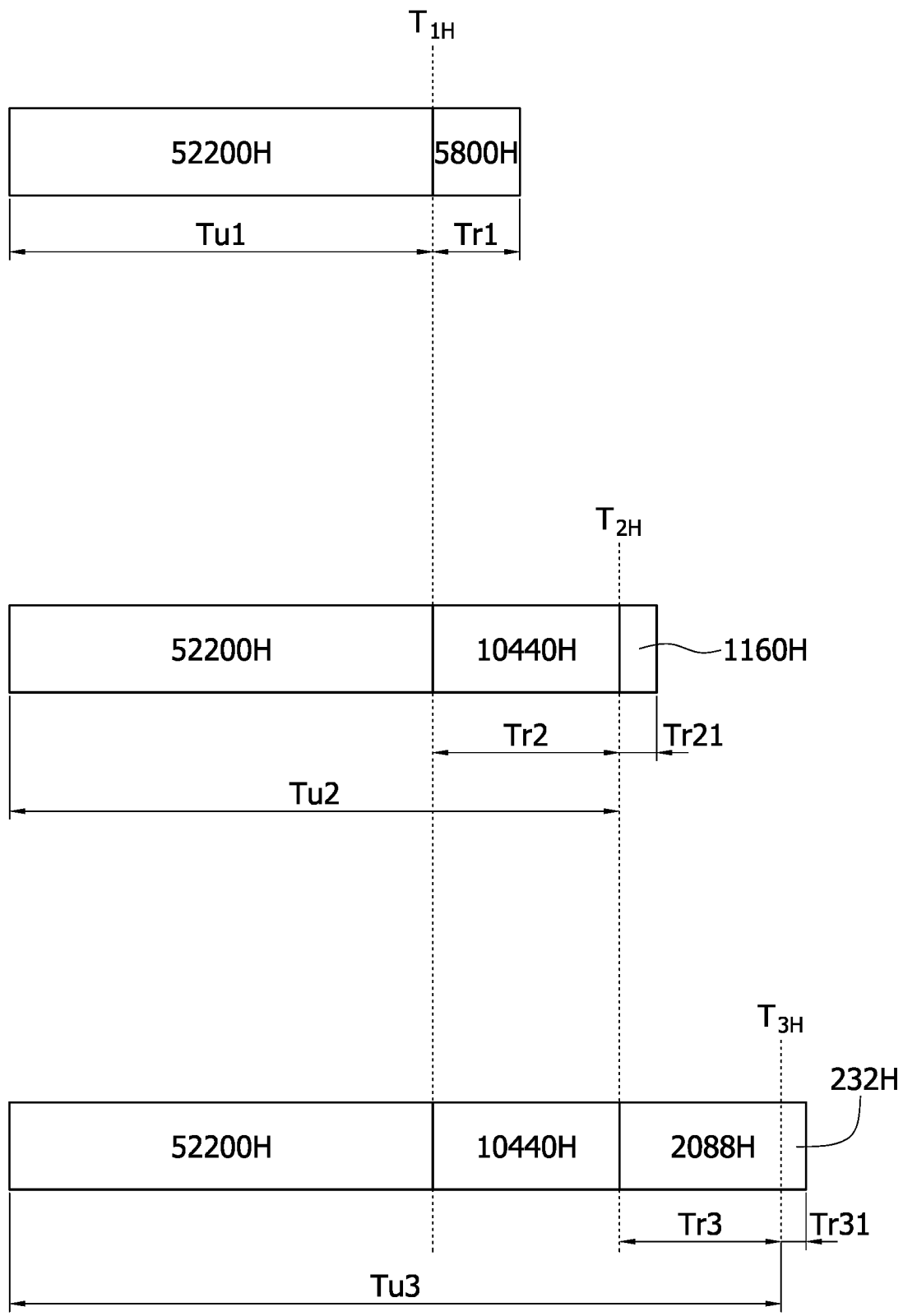
FIG. 14 is schematic view of prolonging used time of the bearing of the brushless DC motor according to the present disclosure.

Afterward, executing an alarm operation when the used time reaches a predetermined time (S104). As shown in FIG. 14, the predetermined time is $T_{1H}$, and when the used time Tu1 reaches the predetermined time $T_{1H}$, the alarm operation is executed. As mentioned above, by generating/outputting an alarm signal by the central processing unit 31 to notify the users or operators. For example, in one embodiment, the predetermined time $T_{1H}$ is determined according to a ratio of the bearing life, such as 0.9, that is, the predetermined time $T_{1H}$ is 52200 hours (58000*0.9=52200). Therefore, when the used time reaches 52200 hours ($T_{1H}$), the alarm operation is executed.

Afterward, decreasing the speed of the brushless DC motor to run at a second speed according to a second operation curve to prolong the used time of the bearing (S105). Once the alarm operation is executed in the step (S104), the speed of the brushless DC motor is decreased to run at the second speed. In this embodiment, the first operation curve is, for example, shown in FIG. 13A, and the second operation curve is, for example, shown in FIG. 13B, that is, the relationship between the speed (RPM) and PWM (%) of FIG. 13A is different that of FIG. 13B. That is, the first speed and the second speed are provided according to different operation curves (i.e., the former corresponds to the first operation curve, and the latter corresponds to the second operation curve). As disclosed in the step (S101) and referred to FIG. 13A, the first speed is up to 30000 rpm. However, when the alarm operation is executed, a top speed of the brushless DC motor is decreased to run at 15000 rpm shown in FIG. 13B, i.e., the second speed is 15000 rpm. In other words, the rotation speed of the brushless DC motor is decreased from 30000 rpm (shown in FIG. 13A) to 15000 rpm. However, the above is only a detailed description and drawings of the preferred embodiments of the present disclosure, but the features of the present disclosure are not limited thereto, and are not intended to limit the present disclosure. In other words, the second speed may be 20000 rpm, or others.

Therefore, as correspondingly shown in FIG. 14, since the rotation speed of the brushless DC motor is decreased, the usable time (i.e., the bearing life) of the bearing can be prolonged/increased. As shown in FIG. 14, the middle part shows the prolonging bearing life, that is, the original 5800-hour remaining used time Tr1 is prolonged to 11600 hours according to the following calculation:

Tu1=$T_{1H}$=58000*0.9=52200 (hours), and therefore the remaining used time Tr2 is prolonged to 58000*0.1*2*0.9=11600 (hours), and the Tr21=11600*0.1=1160 (hours), and Tu2=$T_{2H}$=Tu1+ 2*Tr1*0.9=52200+10440=62640 (hours).

Accordingly, the brushless DC motor can operate at a relatively high efficiency, and the bearing life of the bearing can be prolonged to increase the flexibility of operating the brushless DC motor without replacing the original used bearing(s).

Figure 11:
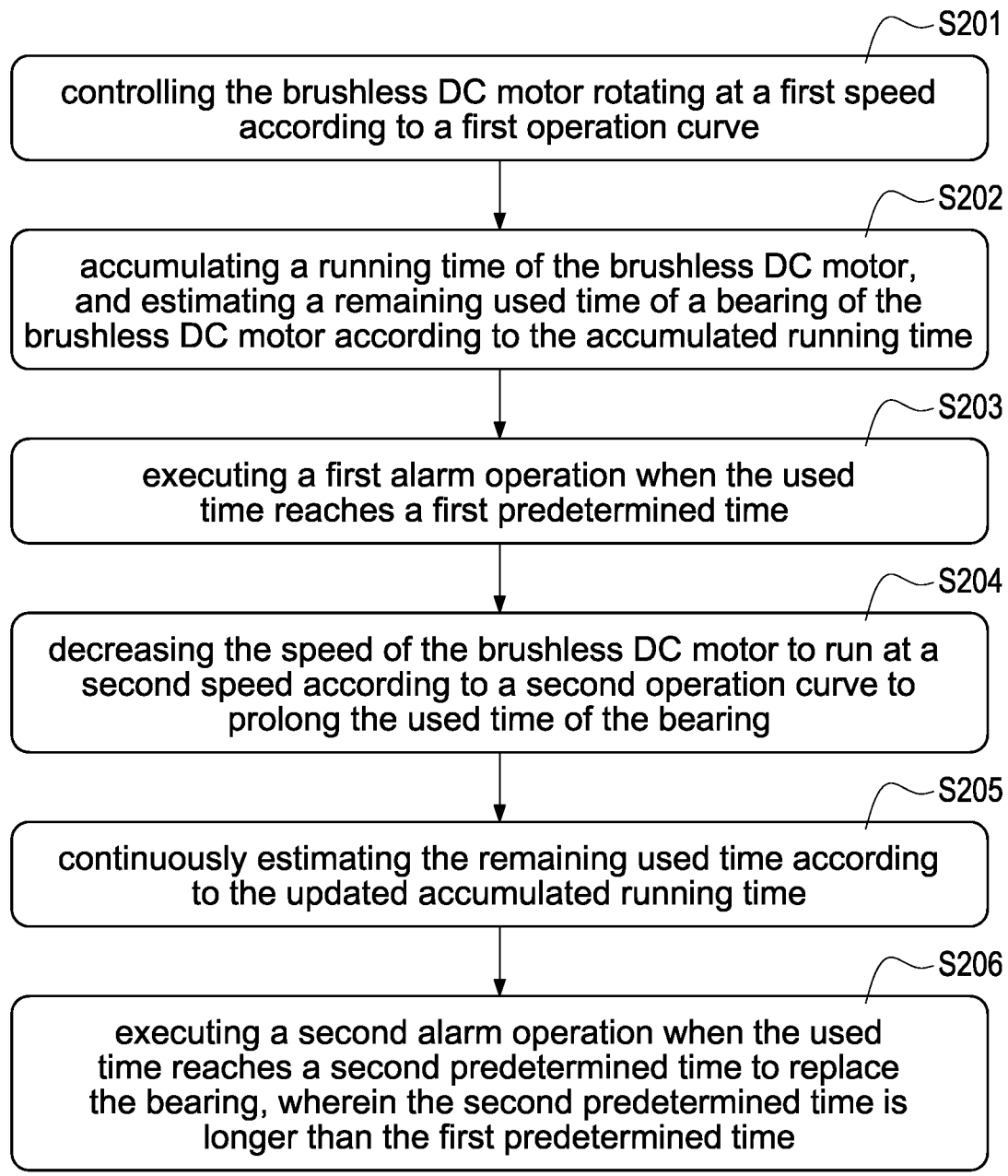
FIG. 11 is a flowchart of a method of adaptively controlling the brushless DC motor according to a second embodiment of the present disclosure.

Please refer to FIG. 11, which shows a flowchart of a method of adaptively controlling the brushless DC motor according to a second embodiment of the present disclosure. The method includes the following steps of: controlling the brushless DC motor rotating at the first speed according to an operation curve (S201), and afterward accumulating a running time of the brushless DC motor, and estimating a remaining used time of a bearing of the brushless DC motor according to the accumulated running time (S202). In particular, steps (S201) and (S202) are corresponding to steps (S101), (S102), and (S103) shown in FIG. 10, and therefore the detail description is omitted here for conciseness.

Afterward, executing a first alarm operation when the used time reaches the first predetermined time $T_{H1}$ (S203). In comparison with the first embodiment shown in FIG. 10, the second embodiment shown in FIG. 11 provides multiple alarm operations. For convenience, in this embodiment, two alarm operations (i.e., a first alarm operation and a second alarm operation) are taken as an example. It is similar to the first embodiment, as shown in FIG. 13A, FIG. 13B, FIG. 13C, and FIG. 14, the first predetermined time is $T_{1H}$, and when the used time Tr1 reaches the first predetermined time $T_{1H}$, the first alarm operation is executed. For example, when the first predetermined time $T_{1H}$ is determined according to a ratio of the bearing life, such as 0.9, that is, the first predetermined time $T_{1H}$ is 52200 hours. Therefore, when the remaining used time reaches 5800 hours, the first alarm operation is executed.

Afterward, decreasing the speed of the brushless DC motor to run at the second speed according to the second operation curve to prolong the used time of the bearing (S204). Since the step (S204) is similar to the step (S105), and therefore the detail description is omitted here for conciseness.

Afterward, continuously estimating the remaining used time according to the updated accumulated running time (S205).

Afterward, executing a second alarm operation when the used time reaches the second predetermined time to replace the bearing (S206). As shown in FIG. 14, the second predetermined time $T_{2H}$ is determined according to a ratio of the bearing life, such as 0.9, that is, the second predetermined time $T_{2H}$ is 62640 hours (52200+ 5800*2*0.9=62640). Therefore, when the used time reaches 62640 hours, the second alarm operation is executed. In particular, the second predetermined time $T_{2H}$ is longer than the first predetermined time $T_{1H}$.

In this condition, i.e., the second alarm operation is executed, since the remaining used time of the bearing is not too much, it is suitable time to find, purchase, and to replace other new bearing(s) for the users or operators.

In particular, the preset disclosure is not limited to two alarm operations, that is, as shown in FIG. 14, a third predetermined time $T_{3H}$ or other predetermined times may be introduced to prolong the used time of the baring and adaptively control the brushless DC motor, and the detail description is omitted here for conciseness.

The above is only a detailed description and drawings of the preferred embodiments of the present disclosure, but the features of the present disclosure are not limited thereto, and are not intended to limit the present disclosure. All the scope of the present disclosure shall be subject to the scope of the following claims. The embodiments of the spirit of the present disclosure and its similar variations are intended to be included in the scope of the present disclosure. Any variation or modification that can be easily conceived by those skilled in the art in the field of the present disclosure can be covered by the following claims.

What is claimed is:

1. A method of controlling a brushless DC motor, comprising steps of:
    controlling the brushless DC motor rotating at a first speed according to a first relationship between a speed of the brushless DC motor and a duty cycle of a pulse-width modulation signal,
    accumulating a running time of the brushless DC motor,
    estimating a remaining used time of a bearing of the brushless DC motor according to the accumulated running time,
    executing an alarm operation when the used time reaches a predetermined time, and recording an original remaining used time, and
    decreasing the speed of the brushless DC motor to run at a second speed according to a second relationship between the speed of the brushless DC motor and the duty cycle of the pulse-width modulation signal when the alarm operation is executed to prolong the used time of the bearing by prolonging the original remaining used time to a prolonged remaining used time,
    wherein the prolonged remaining used time equals the original remaining used time multiplied by a ratio between a speed when the duty cycle is 100% in the first relationship and a speed when the duty cycle is 100% in the second relationship.

2. The method of controlling the brushless DC motor as claimed in claim 1, wherein the predetermined time is decided according to a ratio of bearing life of the bearing.

3. The method of controlling the brushless DC motor as claimed in claim 1, wherein the ratio is 0.9.

4. The method of controlling the brushless DC motor as claimed in claim 1, wherein a highest value of the second speed is half the first speed.

5. The method of controlling the brushless DC motor as claimed in claim 1, further comprising steps of:
    calculating the running time of the brushless DC motor when the brushless DC motor is in a normal operation state, and
    recording the running time when the brushless DC motor is in an abnormal operation state.

6. The method of controlling the brushless DC motor as claimed in claim 1, wherein an alarm signal is outputted when the alarm operation is executed.

7. The method of controlling the brushless DC motor as claimed in claim 1, further a step of:
    displaying the remaining used time of the bearing.

8. The method of controlling the brushless DC motor as claimed in claim 1, wherein the running time is accumulated by adding the recorded running time to the previous accumulated running time.

9. A method of controlling a brushless DC motor, comprising steps of:
    controlling the brushless DC motor rotating at a first speed according to a first relationship between a speed of the brushless DC motor and a duty cycle of a pulse-width modulation signal,
    accumulating a running time of the brushless DC motor, and estimating a remaining used time of a bearing of the brushless DC motor according to the accumulated running time,
    executing a first alarm operation when the used time reaches a first predetermined time, and recording an original remaining used time,
    decreasing the speed of the brushless DC motor to run at a second speed according to a second relationship between the speed of the brushless DC motor and the duty cycle of the pulse-width modulation signal when the alarm operation is executed to prolong the used time of the bearing by prolonging the original remaining used time to a prolonged remaining used time,
    wherein the prolonged remaining used time equals the original remaining used time multiplied by a ratio between a speed when the duty cycle is 100% in the first relationship and a speed when the duty cycle is 100% in the second relationship,
    continuously estimating the remaining used time according to the updated accumulated running time, and
    executing a second alarm operation when the used time reaches a second predetermined time to replace the bearing.

10. The method of controlling the brushless DC motor as claimed in claim 9, wherein the second predetermined time is longer than the first predetermined time.

11. The method of controlling the brushless DC motor as claimed in claim 9, wherein the first predetermined time and the second predetermined time are decided according to a ratio of bearing life of the bearing.

12. The method of controlling the brushless DC motor as claimed in claim 11, wherein the ratio is fixed.

13. The method of controlling the brushless DC motor as claimed in claim 12, wherein the ratio is 0.9.

14. The method of controlling the brushless DC motor as claimed in claim 11, wherein the ratio is adjustable.

15. The method of controlling the brushless DC motor as claimed in claim 9, wherein a highest value of the second speed is half the first speed.

16. The method of controlling the brushless DC motor as claimed in claim 9, further comprising steps of:
    calculating the running time of the brushless DC motor when the brushless DC motor is in a normal operation state, and
    recording the running time when the brushless DC motor is in an abnormal operation state.

17. The method of controlling the brushless DC motor as claimed in claim 9, wherein a first alarm signal is outputted when the first alarm operation is executed, and a second alarm signal is outputted when the second alarm operation is executed.

18. The method of controlling the brushless DC motor as claimed in claim 9, further a step of:
    displaying the remaining used time of the bearing.

19. The method of controlling the brushless DC motor as claimed in claim 9, wherein the running time is accumulated by adding the recorded running time to the previous accumulated running time.

* * * * *